United States Patent
Lampe et al.

(10) Patent No.: US 7,582,166 B2
(45) Date of Patent: Sep. 1, 2009

(54) HOLDER FOR SUPPORTING WAFERS DURING SEMICONDUCTOR MANUFACTURE

(75) Inventors: Michael Lampe, St. Marys, PA (US); Burl Moon, Richardson, TX (US)

(73) Assignee: SGL Carbon, LLC, Charlotte, NC (US)

( * ) Notice: Subject to any disclaimer, the term of this patent is extended or adjusted under 35 U.S.C. 154(b) by 276 days.

(21) Appl. No.: 10/909,711

(22) Filed: Aug. 2, 2004

(65) Prior Publication Data

US 2005/0022746 A1 Feb. 3, 2005

Related U.S. Application Data

(60) Provisional application No. 60/492,063, filed on Aug. 1, 2003.

(51) Int. Cl.
*H01L 21/00* (2006.01)
*C23C 14/00* (2006.01)
*C23C 16/00* (2006.01)

(52) U.S. Cl. .................. 118/728; 118/724; 118/725; 156/345.51; 156/345.52; 156/345.53; 204/298.01; 204/192.1

(58) Field of Classification Search ......... 118/715–733; 156/345.51–345.5; 204/298.01–298.3, 192.1–192.37
See application file for complete search history.

(56) References Cited

U.S. PATENT DOCUMENTS

| | | | |
|---|---|---|---|
| 4,821,674 A | 4/1989 | deBoer et al. | 118/666 |
| 5,403,401 A | 4/1995 | Haafkens et al. | 118/728 |
| 5,427,620 A | 6/1995 | deBoer et al. | 118/725 |
| 5,445,677 A * | 8/1995 | Kawata et al. | 118/724 |
| 5,620,525 A * | 4/1997 | van de Ven et al. | 118/728 |
| 5,624,499 A * | 4/1997 | Mizuno et al. | 118/725 |
| 5,782,979 A * | 7/1998 | Kaneno et al. | 118/500 |
| 6,042,653 A * | 3/2000 | Tanaka et al. | 118/728 |
| 6,113,702 A * | 9/2000 | Halpin et al. | 118/725 |
| 6,245,152 B1 * | 6/2001 | Imai et al. | 118/728 |
| 6,454,865 B1 * | 9/2002 | Goodman et al. | 118/728 |

FOREIGN PATENT DOCUMENTS

| | | | |
|---|---|---|---|
| JP | 55143036 A | * | 11/1980 |
| JP | 10256163 A | * | 9/1998 |
| JP | 10335437 A | * | 12/1998 |

* cited by examiner

*Primary Examiner*—Ram N. Kackar
(74) *Attorney, Agent, or Firm*—K&L Gates LLP (57) ABSTRACT

An improved wafer holder design is described which has manufacturing and performance advantages over present state-of-the-art holders used in various wafer processing applications. The new wafer holder design incorporates a series of short radial grooves. The grooves extend from the base of a circular channel, which runs along the outside diameter of the substrate wafer recess, to a fixed radial location which varies based on wafer size and thickness. The grooves provide a slight overlap with the wafer to facilitate the free exchange of gases beneath the wafer necessary for wafer loading and unloading operations. The short length of the radial grooves make the wafer holder easier to manufacture and offer more robust performance compared to the present state-of-the-art holders.

21 Claims, 10 Drawing Sheets

Fig. 1A

PRIOR ART

PRIOR ART

Fig. 1B

PRIOR ART

HOLDER FOR SUPPORTING WAFERS DURING SEMICONDUCTOR MANUFACTURE

CROSS-REFERENCE TO RELATED APPLICATION

This application is entitled to the benefit of, and claims priority to, provisional U.S. Patent Application Ser. No. 60/492,063 filed Aug. 1, 2003 and entitled "SUSCEPTOR FOR SUPPORTING WAFERS DURING SEMICONDUCTOR MANUFACTURE," the entirety of which is incorporated herein by reference.

BACKGROUND OF THE PRESENT INVENTION

1. Field of the Present Invention

The present invention relates generally to the manufacture of substrate wafers of the type used in producing semiconductor devices, and, in particular, to susceptors and other substrate wafer holders for use in a substrate supporting mechanism in a reaction chamber during semiconductor manufacturing processes.

2. Background

Typical wafer holders are described in U.S. Pat. Nos. 4,821,674 and 5,427,620. These wafer holders are typically used to support a single substrate wafer during various wafer processes during the manufacture of integrated circuits. Such process applications may include silicon application processes such as chemical vapor deposition ("CVD") and physical vapor deposition ("PVD"), thermal process applications used for treatment of semiconductor wafer substrates such as rapid thermal processing ("RTP") and high temperature etch processing, and the like.

To save process time, substrate wafers must be loaded at an elevated temperature, and when the wafers are placed on a flat, smooth, unbroken surface, the heat-related convection currents affect the ability of the substrate wafer to settle uniformly. Thus, as shown in the aforementioned patents, a series of intersecting channels is typically machined or otherwise applied to the wafer contact surface of the holder, the intent of which is to provide a free flow of gases between the substrate and holder to avoid undesired movement of the substrate during loading and unloading operations. The presence of the intersecting channels alleviates the substrate settling issue by allowing the hot gases to escape from underneath the wafer. The intersecting channels also facilitate loading the wafers using the Bernoulli principle.

The above cited patents depict a wafer holder with only a limited number of intersecting channels. However, in practice, the number of channels required is very large because of the need to maintain a uniform temperature profile over the surface of the substrate wafer which the holder supports. In addition, it is difficult to maintain the uniformity of the channeled surface, which is critical to avoiding issues such as image transfer to the process wafer. Both temperature uniformity and image transfer issues must be avoided to ensure proper electrical and physical properties of the process wafer along with any deposited coatings.

Figure 1A:
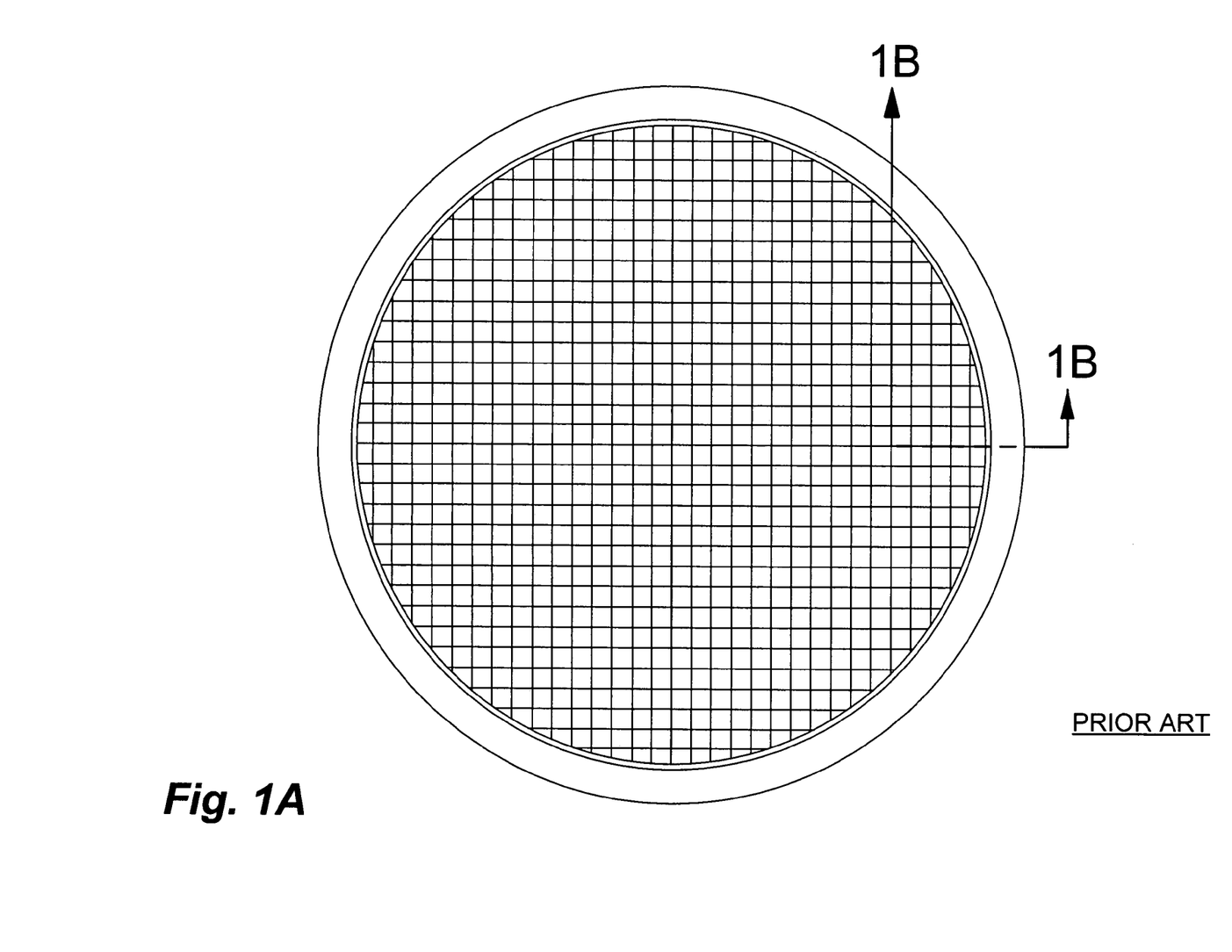
FIG. 1A is a top view of a typical prior art wafer holder.
Figure 1B:
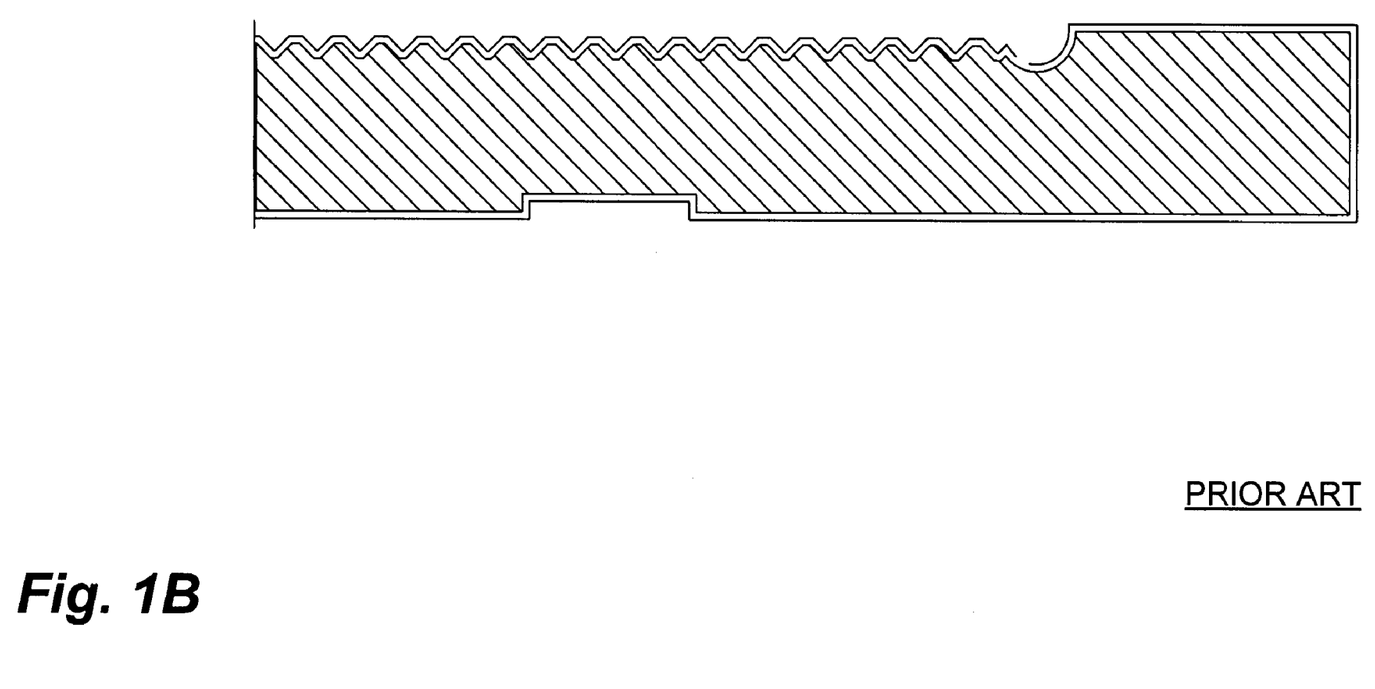
FIG. 1B is a side cross-sectional view of the prior art wafer holder of FIG. 1A, taken along line 1B-1B.
Figure 1C:
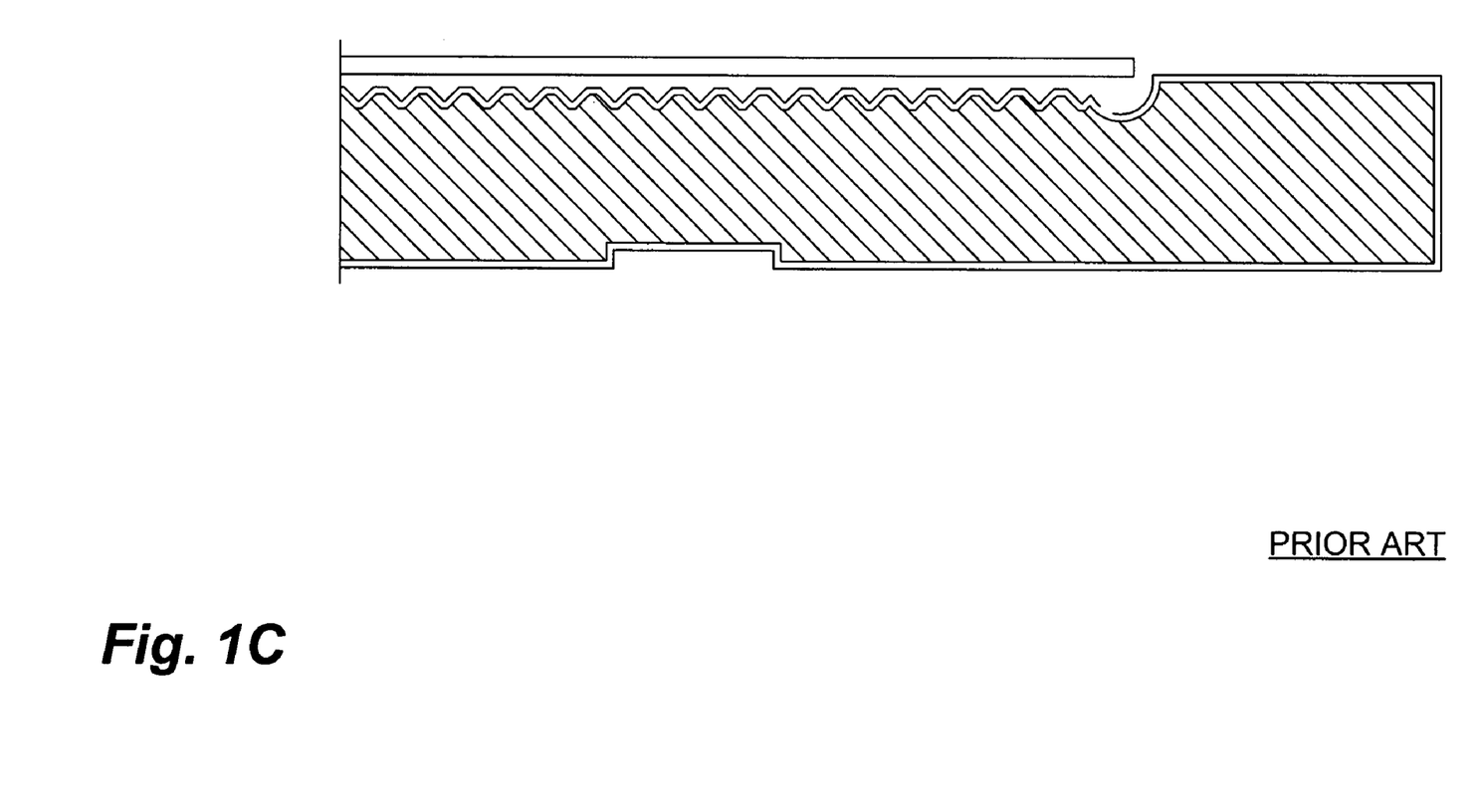
FIG. 1C is a side cross-sectional view of the prior art wafer holder of FIG. 1B, shown with a wafer positioned thereon.

U.S. Pat. No. 5,403,401 cites a number of manufacturing issues involving wafer holders made with a substrate contact face possessing a series of underlying, intersecting channels, a typical example of which is shown in FIGS. 1A-1C. Specifically, wafer holders of this design are difficult to maintain flat during manufacture if the channels exist only on one face of the holder. After machining, these wafer holders, which are typically machined from graphite, receive a coating, such as silicon carbide (SiC), deposited by CVD at high temperatures. As the holder cools to room temperature, differential shrinkage between the holder substrate and the coating generally leads to a state of stress, wherein the coating is under compression and the substrate under tension (although this stress state may be reversed, depending upon the properties of the substrate and the coating). The amount of stress that develops is dependent in part upon the surface area. As a result, large surface area differences between the two faces of the same holder, such as those that may exist when only one face is machined, can lead to large differences in stress, which in turn cause the part to distort or warp.

To alleviate this problem, the above-cited patent suggests that similar machining detail should be added to both faces of the wafer holder in order to avoid the differences in stress and thus ensure that the part remains flat after coating. Unfortunately, adding machining detail to both sides of the wafer holder can significantly increase its manufacturing cost. Another solution cited in the above patent is to tailor the thickness of the coating so that a controlled coating differential is maintained between the two opposite faces. In principle, this is an appropriate fix; however, in practice it can be difficult to maintain a consistent coating thickness differential between faces. There is also the problem that the amount of thickness differential required is a function of the differential in coefficient of thermal expansion ("CTE") between the holder substrate and the surface coating. Unfortunately, certain holder substrate materials, such as graphite, have CTE's which span a range, which complicates this process. For example, the range for graphite is affected by the type of coke used in its manufacture, binder levels, particle sizing, and processing temperatures.

There is also a need to minimize the total contact area between the wafer holder and substrate wafer in order to maintain a uniform temperature profile across the surface of the wafer as well as to minimize any markings to the backside of the substrate wafer. In order to minimize total contact area, the number of channels is intentionally high, which means that the grids formed at the channel intersections are kept small. It is the tops of these individual grid areas, formed by the channels, that provide support for the wafer substrate. The problem with small grids is that they are relatively weak areas of the holder surface, and thus are prone to damage. This in turn can affect the lifetime of the wafer holder if one or more grids become damaged.

One additional drawback of wafer holders having a high number of intersecting channels on one or more faces is that such wafer holders are more prone to developing pinholes in the surface coating. This will also cause the wafer holder to be rejected, since once the coating is breached, the substrate beneath the coating is exposed to the process environment. The higher occurrence of pinholes through the surface coating on parts machined with a high number of channels is due to coating thickness variations along with cleaning issues, which are more problematic at the base of the machining detail. (Pinhole formation occurs over a period of time during use of the holder. This is generally a surface erosion problem, which can be affected by cleanliness.)

One final drawback to wafer holders machined with a high number of intersecting channels is that it is often desired to machine a concave-shaped profile into the face of the holder that is in contact with the substrate wafer, particularly for large diameter wafers and/or lower temperature processes which require a higher level of temperature uniformity. The presence of a high amount of surface detail greatly increases the complexity of machining such a profile, which further adds to the cost of the part.

SUMMARY OF THE PRESENT INVENTION

The wafer holder described in the present invention has a number of advantages over present state-of-the-art wafer holders. For example, it requires a smaller amount of machining and requires less complex machining, making it easier to incorporate concave surface profiles, especially for large substrate wafer diameters. This, in turn, provides improved part-to-part consistency. It is also more damage tolerant, making it easier to maintain dimensional control during manufacture, and provides improved wafer holder performance.

Broadly defined, the present invention according to one aspect is a wafer holder for holding semiconductor substrate wafers in a chemical vapor deposition system, including: a holder body having a top surface; a circular wafer recess in the top surface of the holder body, the wafer recess having an outer perimeter and an interior area; and a plurality of slots arranged in the top surface of the holder body, each beginning adjacent the outer perimeter of the wafer recess and extending toward and terminating in the interior area of the wafer recess.

In features of this aspect, the wafer holder further includes a circular groove extending around the outer perimeter of the wafer recess; substantially all of the slots extend radially from the circular groove toward the interior area of the wafer recess; the holder body is formed from at least one of the following: graphite, silicon, silicon nitride, silicon carbide, quartz or aluminum oxide; a surface coating may be applied to at least the top surface of the holder body; the surface coating is formed from at least one of the following: silicon carbide, silicon nitride, pyrolytic graphite, pyrolytic carbon, diamond, aluminum nitride, aluminum oxide, silicon dioxide or tantalum carbide; the wafer recess may encompass a concave surface; the concave surface of the wafer recess is adapted to aid in gas flow beneath a substrate wafer disposed in the wafer recess; the concave surface of the wafer recess is adapted to help maintain a uniform temperature profile across the surface of a substrate wafer disposed in the wafer recess; the number of slots is selected to minimize negative effects on the thermal profile of a substrate wafer disposed in the wafer recess; and the number of slots is selected to allow sufficient gas flow beneath the substrate wafer to aid in proper loading and unloading operations.

In other features of this aspect, the dimensions of the slots are selected to minimize negative effects on the thermal profile or backside markings of a substrate wafer disposed in the wafer recess; the dimensions of the slots are selected to provide effective gas flow beneath substrate wafers for the purpose of aiding in proper loading and unloading operations; each of the plurality of slots is between 0.030 in. and 1.000 in. in length, and preferably between 0.035 in. and 0.065 in. in length; each of the plurality of slots is between 0.010 in. and 0.030 in. in width, and preferably between 0.015 in. and 0.025 in. in width; and each of the plurality of slots is at least 0.001 in. deep, and preferably between 0.004 in. and 0.008 in. deep.

In other features of this aspect, the wafer holder is a susceptor; the wafer holder further includes a circumferential ledge for supporting the edges of a wafer; the plurality of slots are disposed at least partly in the circumferential ledge; and the wafer recess. is a first wafer recess, the plurality of slots is a first plurality of slots, and the wafer holder further includes a second circular wafer recess in the top surface of the holder body adjacent the first circular wafer recess, the wafer recess having an outer perimeter and an interior area, and a second plurality of slots arranged in the top surface of the holder body, each beginning adjacent the outer perimeter of the second wafer recess and extending toward and terminating in the interior area of the second wafer recess.

The present invention according to another aspect is a wafer holder for holding semiconductor substrate wafers in a chemical vapor deposition system, including: a holder body having a top surface; a circular wafer recess in the top surface of the holder body, the wafer recess having an outer perimeter and an interior area; and a plurality of non-interesting slots arranged in the top surface of the holder body, each beginning adjacent the outer perimeter of the wafer recess and extending toward and terminating in the interior area of the wafer recess.

In features of this aspect, the wafer holder further includes a circular groove extending around the outer perimeter of the wafer recess; substantially all of the slots extend radially from the circular groove toward the interior area of the wafer recess; the holder body is formed from at least one of the following: silicon, silicon nitride, silicon carbide, quartz or aluminum oxide; a surface coating may be applied to at least the top surface of the holder body; the surface coating is formed from at least one of the following: silicon carbide, silicon nitride, pyrolytic graphite, pyrolytic carbon, diamond, aluminum nitride, aluminum oxide, silicon dioxide or tantalum carbide; the wafer recess may encompass a concave surface; the concave surface of the wafer recess is adapted to aid in gas flow beneath a substrate wafer disposed in the wafer recess; the concave surface of the wafer recess is adapted to help maintain a uniform temperature profile across the surface of a substrate wafer disposed in the wafer recess; the number of slots is selected to minimize negative effects on the thermal profile of a substrate wafer disposed in the wafer recess; and the number of slots is selected to allow sufficient gas flow beneath the substrate wafer to aid in proper loading and unloading operations.

In other features of this aspect, the dimensions of the slots are selected to minimize negative effects on the thermal profile or backside markings of a substrate wafer disposed in the wafer recess; the dimensions of the slots are selected to provide effective gas flow beneath substrate wafers for the purpose of aiding in proper loading and unloading operations; each of the plurality of slots is between 0.030 in. and 1.000 in. in length, and preferably between 0.035 in. and 0.065 in. in length; and each of the plurality of slots is between 0.010 in. and 0.030 in. in width, and preferably between 0.015 in. and 0.025 in. in width; and each of the plurality of slots is at least 0.001 in. deep, and preferably between 0.004 in. and 0.008 in. deep.

In other features of this aspect, the wafer holder is a susceptor; the wafer holder further includes a circumferential ledge for supporting the edges of a wafer; the plurality of slots are disposed at least partly in the circumferential ledge; and the wafer recess is a first wafer recess, the plurality of slots is a first plurality of slots, and the wafer holder further includes a second circular wafer recess in the top surface of the holder body adjacent the first circular wafer recess, the wafer recess having an outer perimeter and an interior area, and a second plurality of slots arranged in the top surface of the holder body, each beginning adjacent the outer perimeter of the second wafer recess and extending toward and terminating in the interior area of the second wafer recess.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

The preferred embodiments of the present invention will be described with reference to an otherwise-conventional chemical vapor deposition ("CVD") system 10, because CVD is an example of a typical process for which the wafer holder of the present invention may find application. However, it should be understood that the wafer holder of the present invention may be used in a wide variety of wafer processes, including physical vapor deposition ("PVD"), rapid thermal processing ("RTP"), high temperature etch processing, and other thermal processing, and generally including any other process in which a semiconductor wafer must be lifted from a generally flat surface.

Figure 2:
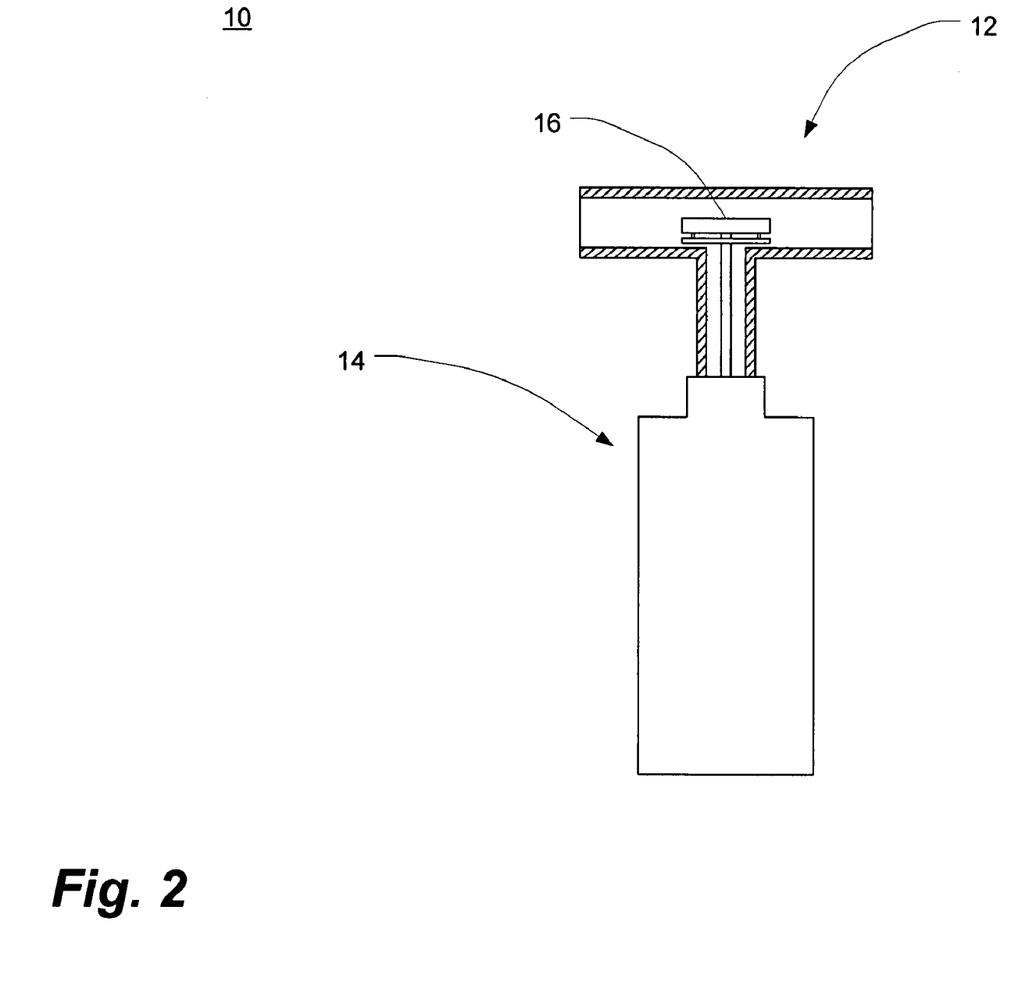
FIG. 2 is a block diagram of a conventional chemical vapor deposition system.

FIG. 2 is a block diagram of a conventional chemical vapor deposition ("CVD") system 10. The CVD system 10 includes a reaction chamber 12 and a support mechanism 14. The reaction chamber 12 may be of any conventional design, including the type sometimes referred to as a horizontal flow reaction chamber such as that disclosed in U.S. Pat. No. 5,427,620, the entirety of which is incorporated herein by reference.

The support mechanism 14 is preferably rotatable and may be likewise generally similar to that disclosed in the '620 patent. Of particular relevance, the support mechanism 14 includes a wafer holder 16 disposed within the reaction chamber 12. The wafer holder 16 may be of a type often referred to as a susceptor, which typically is heated inductively, or of other types known to those skilled in the art.

Figure 3:
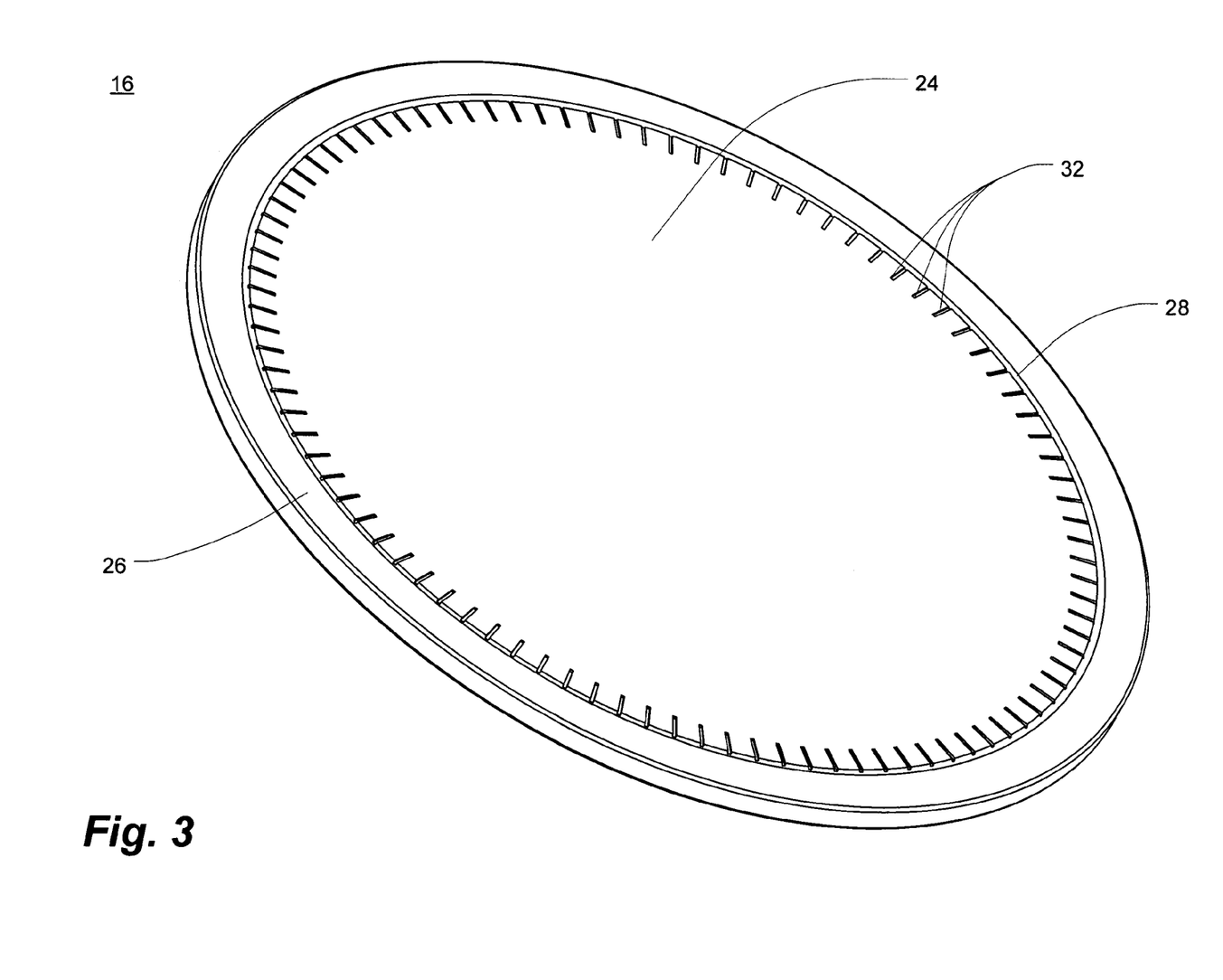
FIG. 3 is a perspective view of the wafer holder of FIG. 2, shown in isolation, in accordance with the preferred embodiments of the present invention.

FIG. 3 is a perspective view of the wafer holder 16 of FIG. 2, shown in isolation, in accordance with the preferred embodiments of the present invention. As illustrated therein, the wafer holder 16 primarily includes a solid body 18 in the general shape of a flattened cylinder. The body 18 may be formed from any conventional wafer holder body material, most commonly including pure graphite but alternatively composed of silicon, silicon nitride, silicon carbide, quartz, aluminum oxide or another ceramic material or metal or metal alloy. The selection of material conventionally depends on the end-user's process requirements.

Figure 4A:
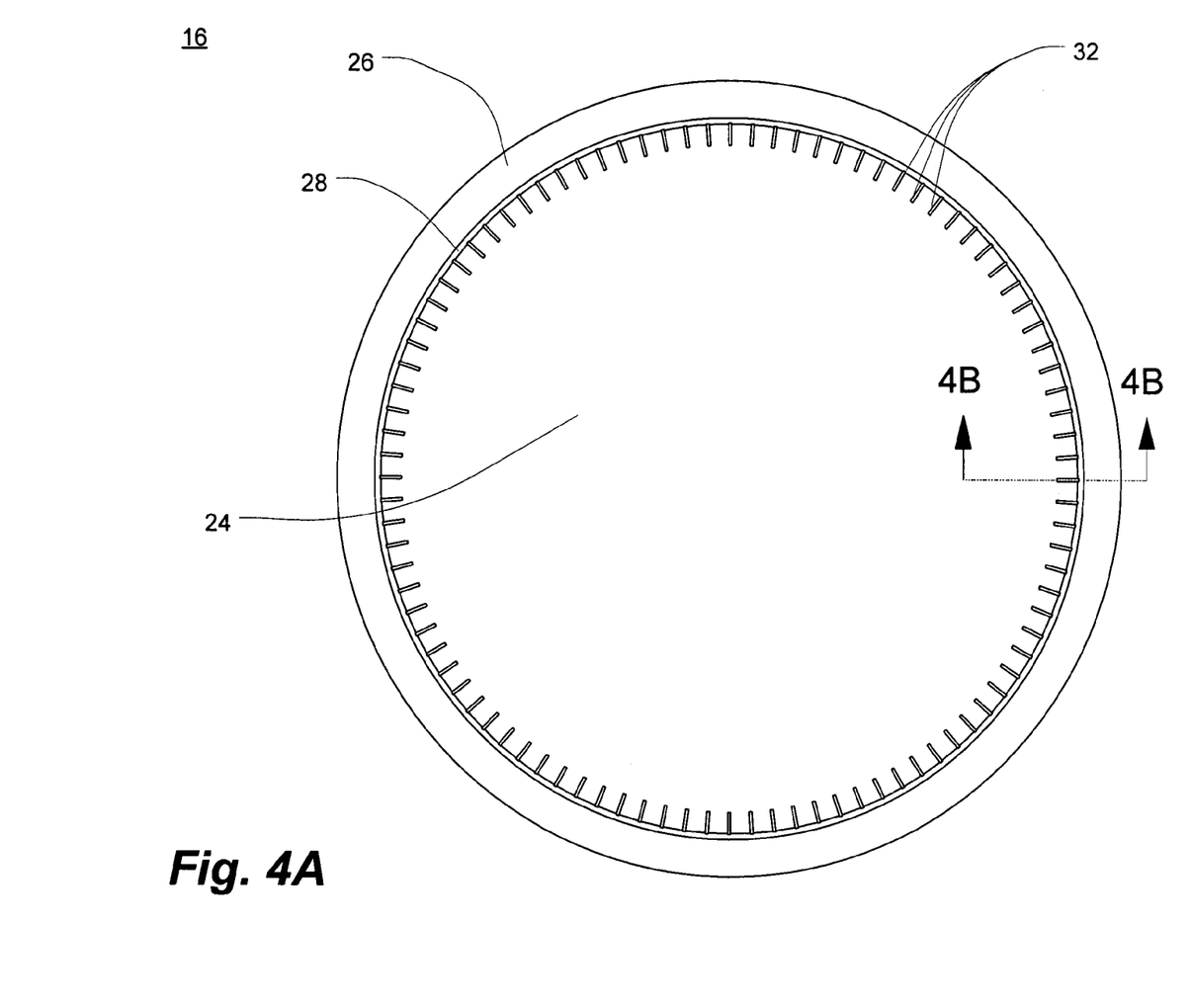
FIG. 4A is a top view of the wafer holder of FIG. 3.
Figure 4B:
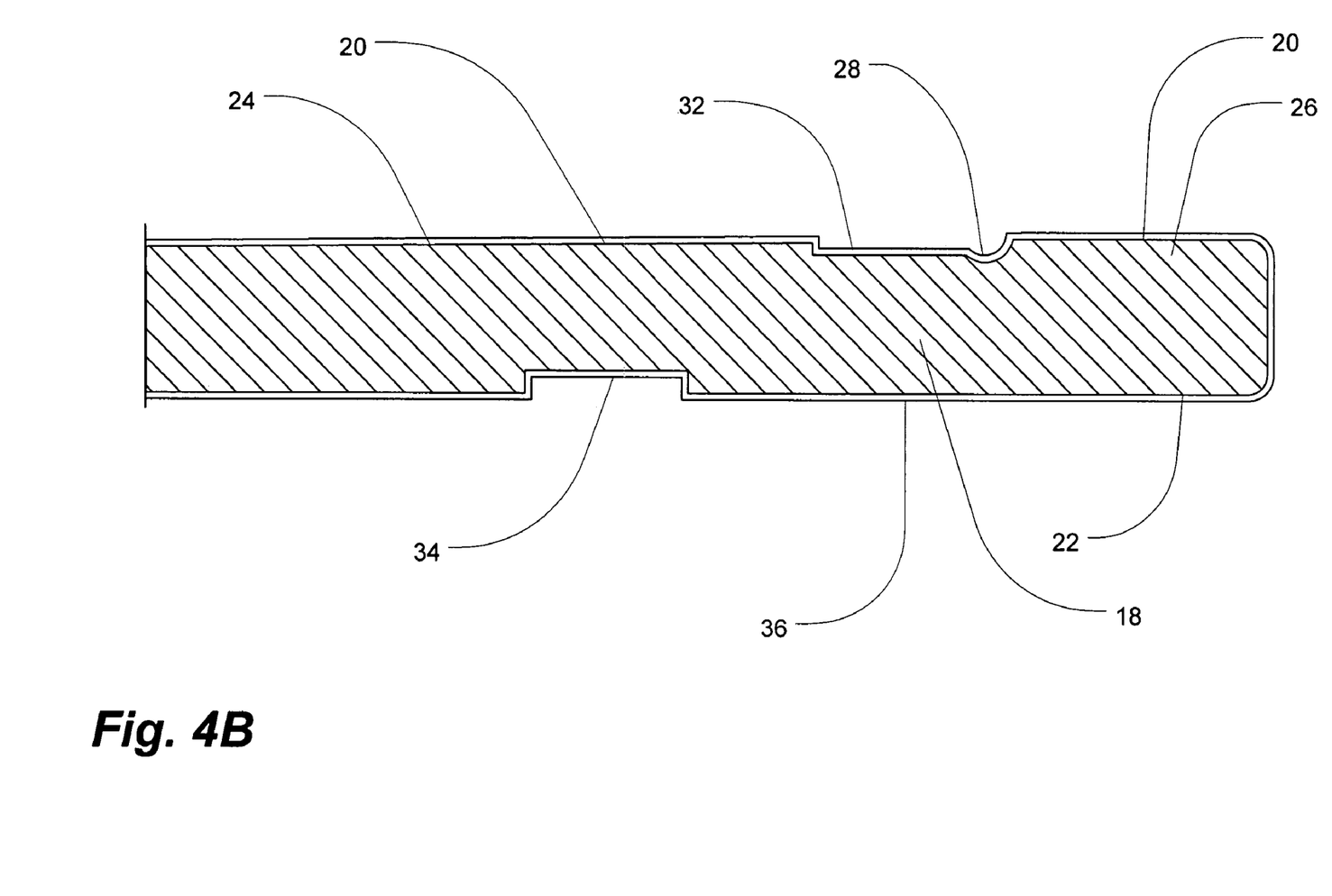
FIG. 4B is a partial side cross-sectional view of the wafer holder of FIG. 4A, taken along line 4B-4B.
Figure 4C:
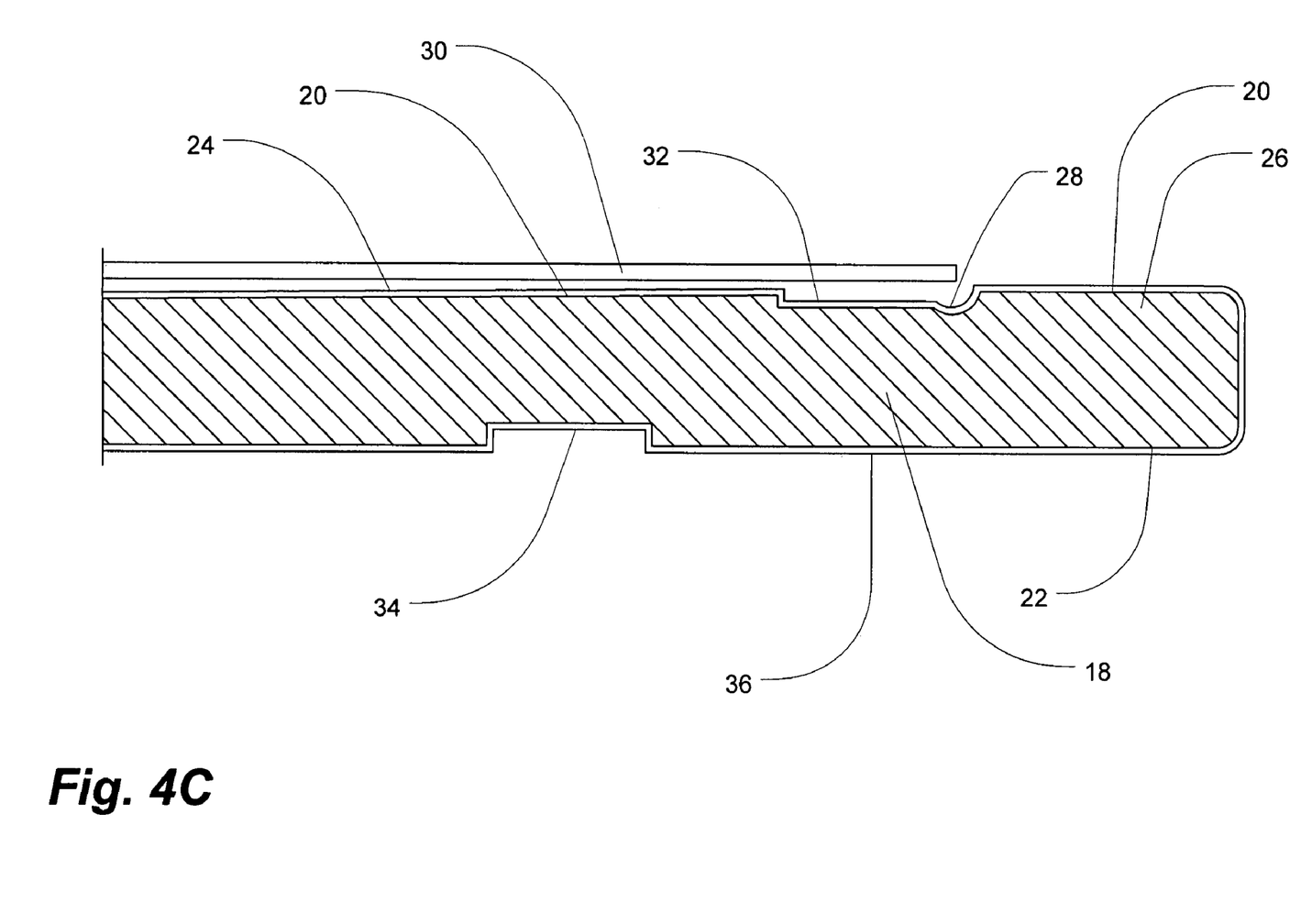
FIG. 4C is a partial side cross-sectional view of the wafer holder of FIG. 4B, shown with a wafer positioned thereon.

FIG. 4A is a top view of the wafer holder 16 of FIG. 3, and FIG. 4B is a partial side cross-sectional view of the wafer holder 16 of FIG. 4A, taken along line 4B-4B. Of particular interest, and as perhaps best understood with reference to FIGS. 4A and 4B, the holder body 18 includes a top surface 20 and a bottom surface 22. Centered on the top surface 20 is a wafer recess 24 formed by a slight depression in the holder body 18, explained below, and defined by an outer circumferential rim 26. At the perimeter of the recess 24, immediately inside the outer rim 26, is arranged a continuous circular groove 28. The wafer recess 24 is adapted to support a wafer 30 therein, and the size of the wafer recess 24, and thus the location of the circular groove 28, is selected in conjunction with the selection of the size of the wafer 30. FIG. 4C is a partial side cross-sectional view of the wafer holder 16 of FIG. 4B, shown with a wafer 30 positioned thereon. As shown, the wafer 30 fits comfortably within the wafer recess 24, with the outer edge of the wafer 30 preferably positioned directly above the circular groove 28.

Though not strictly necessary, the circular groove 28 helps ensure uniform gas flow under the wafer 30 during processing. By increasing the size of the groove 28, the gas flow may be more easily controlled; however, temperature uniformity issues dictate against enlarging the groove too much. The size of the groove 28 is thus generally controlled by conventional principles, and the selection of an appropriately-sized groove may be dependent on the manufacturing process in which the wafer holder 16 is to be used. However, it is known that grooves 28 having a semicircular profile that is 0.035 in. wide and 0.035 in. deep have been used successfully as described herein below.

The top surface 20 further includes a ring of narrow, non-intersecting slots 32 which extend inward from the groove 28 a fixed distance toward the center of the wafer recess 24. The slots 32 are preferably radial in orientation, such that each slot 32 extends directly toward the geometric center of the wafer recess 24, but it will be apparent that the orientation or angle of the slots 32 may vary considerably while still providing a path between the circular groove 28 and the interior area of the wafer recess 24, and that such arrangements are within the scope of the present invention. The depth of each slot is preferably at least 0.001 in., and preferably in the range of 0.004-0.008 in., though other depths may be feasible. The fixed length of the slots 32, along with their width and number, are dependent on the diameter and thickness of the wafer 30 in order to effectively lift the wafer 30 during loading and unloading utilizing the Bernoulli principle.

It is important that the distance that the radial slots 32 extend underneath the wafer 30 (referred to herein as the amount of "slot overlap" with the substrate wafer 30) encompass both CTE-related growth and the possible off-center loading of the substrate wafer 30 in the substrate wafer recess 24. The amount of slot overlap must also be controlled so as not to be so great that it affects temperature uniformity of the substrate wafer 30 or contributes to backside markings on the substrate wafer 30. It is known that extending the slots 32 all the way to the actual center of the interior area of the wafer recess 24 is problematic. However, it is further believed that successful results may be achieved with slots 32 of an inch in length, at least with wafer holders 16 designed to accommodate 6-in. diameter wafers 30. On the other hand, the overlap must be of a minimum length so as to provide sufficient gas flow to facilitate substrate wafer loading and unloading operations using Bernoulli principle. Although neither the minimum or maximum lengths are known, it is known that slots 32 of 0.040-0.060 in. have been used successfully as described herein below.

It is also important to control the number of slots 32 in that, based on a given slot area, a minimum number of slots 32 is required in order to properly engage a substrate wafer 30 during loading and unloading operations. The minimum number is primarily dependent on the surface area of the slots 32 relative to the surface area of the wafer recess 24, since this results in a corresponding lift force. Thus, the number of slots 32 may depend on the width and length of the slots 32 used, as well as the size of the wafer recess 24. Wide slots 32, however, are to be avoided as they will lead to localized thermal effects, and the length of the slots 32 should be controlled as described previously. Exact limits on the number of slots 32 and their width are unknown, but it is known that 96 slots 32, each 0.019 in. wide, have been used successfully in wafer holders 16 designed to accommodate 6-in. diameter wafers 30 as described herein below.

It is also believed that the slots 32 must be arranged in a generally uniform pattern around the perimeter of the wafer recess 24 in order to maintain temperature uniformity and the like. Thus, the spacing between slots 32 is preferably constant around the entire perimeter, and the length, width and depth of each slot 32 is preferably constant. However, it may be possible to use uniform patterns of slots 32 having a uniformly-varying pattern of lengths, widths, or spacings without departing from the scope of the present invention.

The bottom surface 22 of the holder body 18 is of conventional design. A circular support groove 34 may be disposed in the bottom surface 22 such that the wafer holder 16 may be placed or mounted on an appropriate structure in the support mechanism 14, such as the spider-type pedestal, typically composed of quartz, shown in U.S. Pat. No. 5,427,620.

The holder body 18 may or may not be covered with a surface coating 36 composed of one of the following: silicon carbide, silicon nitride, pyrolytic graphite, pyrolytic carbon, diamond, aluminum nitride, aluminum oxide, silicon, silicon dioxide or tantalum carbide. Conventionally, the coating 36 is applied to the entire substrate, including but not limited to the top and bottom surfaces 20, 22.

The slight depression forming the wafer recess 24 may have a slightly concave profile, perhaps best seen in FIG. 4C, that may be created by machining the top surface 20 of the holder body 18. The depression further aids in releasing the substrate wafer 30 from the holder 16 by allowing gases to flow freely beneath the wafer 30 and preventing the wafer 30 from sticking to an otherwise flat surface. Concave surface profiles are desired for improved wafer temperature uniformity due to the tendency of wafers 30 to sag at high temperatures. The deformity caused by the sag will be a function of substrate wafer diameter as well as the end-user's process conditions. Moreover, because temperature uniformity may be optimized when the gap between the sagging wafer 30 and the top surface of the holder body 18 is relatively uniform, the profile of the wafer recess 24 preferably matches or approximates that of the sagging wafer 30. Thus, because the profile of a wafer 30 when sagging is assumed to be roughly spherical, the concavity of the wafer recess 24 may be spherical as well. However, it will be apparent that closer analysis of the profile of a wafer 30 when sagging will likely reveal non-spherical characteristics, and thus the profile of the wafer recess 24 may be varied accordingly.

In general, larger diameter wafers 30 and lower end-use process temperature conditions favor the use of profiles that have a larger dished shape. Reasons for this include the fact that larger wafers 30 are heavier so the need to minimize adhesion between the wafer 30 and the mating face of the substrate holder 16 is more critical. In addition, larger wafers 30 will sag more at temperature than smaller wafers 30, so a larger dished profile may help achieve improved temperature uniformity. The concavity of conventional wafer recesses used in wafer processing may range from 0.002 in. to 0.010 in., with greater concavity required for particularly sensitive processing.

Six susceptor-type wafer holders designed and manufactured according to the principles described herein were tested under standard process conditions. The wafer holder included a wafer recess sized to accommodate wafers having a diameter of 6 in. Each wafer holder included 96 radial slots, each 0.007 in. deep and 0.019 in. wide and 0.040 in. long. The wafer recess of each wafer holder was 0.017 in. deep and concave in profile by 0.002 in., and the continuous groove of each wafer holder was 0.035 in. wide and 0.035 in. deep. The six test parts worked successfully (successful release of a semiconductor wafer from the wafer holder using Bernoulli principle-based pickup) in up to 10,000 runs, which compares very favorably to the typical lifetime experienced in the industry, for conventional wafer holders such as the one illustrated in FIGS. 1A-1C, of approximately 2,000 to 4,000 runs.

In view of such success, a susceptor-type wafer holder designed and manufactured according to the principles described herein was used in a silicon epitaxy deposition process. The wafer holder included a wafer recess sized to accommodate wafers having a diameter of 6 in. The wafer holder included 96 radial slots, each 0.060 in. long, 0.005 in. deep and 0.019 in. wide. The wafer recess was 0.017 in. deep and concave in profile by 0.0025 in. The continuous groove was 0.035 in. wide and 0.035 in. deep. The wafer holder was used successfully in 178 runs before use was discontinued for an unrelated issue. General performance was equal to that of conventional wafer holders such as the wafer holder illustrated in FIGS. 1A-1C, but significantly, all wafer coatings carried out using the test wafer holder were of high quality with no indication of the temperature uniformity problems or image transfer issues described previously.

Figure 5:
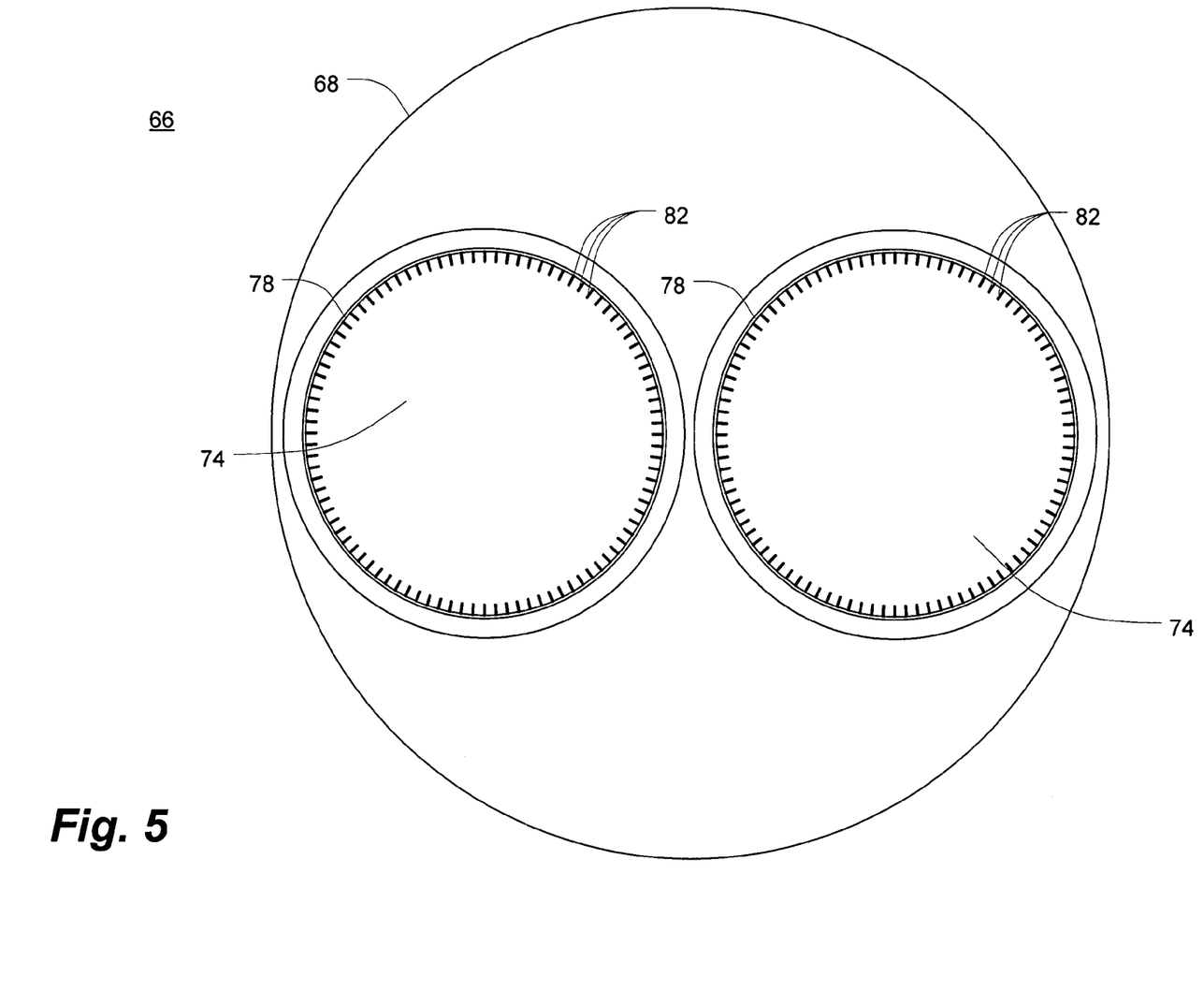
FIG. 5 is a top view of a multiplexed wafer holder, where two wafer recesses are arranged side by side in a single holder body, in accordance with an alternative embodiment of the present invention.

Alternative configurations of the wafer holder of the present invention will be apparent to those of ordinary skill in the art. For example, FIG. 5 is a top view of a multiplexed wafer holder 66, where two wafer recesses 74 are arranged side by side in a single holder body 68, in accordance with an alternative embodiment of the present invention. Each wafer recess 74 includes a circular groove 78 and a plurality of slots 82, similar to the groove 28 and slots 32 provided in the wafer holder 24 previously described. Other than the inclusion of a second wafer recess 74 and the second plurality of slots 82, the wafer holder 66 of FIG. 5 is generally similar to the first wafer holder 16.

Such a configuration may be useful in maximizing the number of wafers 30 produced in a particular reaction chamber 12. For example, a particular reaction chamber 12 may be designed to accommodate the manufacture of 8-in. wafers 30, but a manufacturer sometimes wishes to use the reaction chamber 12 in the manufacture of wafers 30 that are only 4 in.

in diameter. Manufacture of either wafer size may be accomplished through the use of an appropriately-sized wafer holder 16 of the type described herein. However, the manufacture of 4-in. wafers 30 in the 8-in. reaction chamber 12 may be optimized by using a wafer holder 66 such as the one shown schematically in FIG. 5. This approach may further be utilized to design wafer holders (not shown) having other numbers, sizes and arrangements of wafer recesses as will be readily apparent to those of ordinary skill in the art.

Figure 6A:
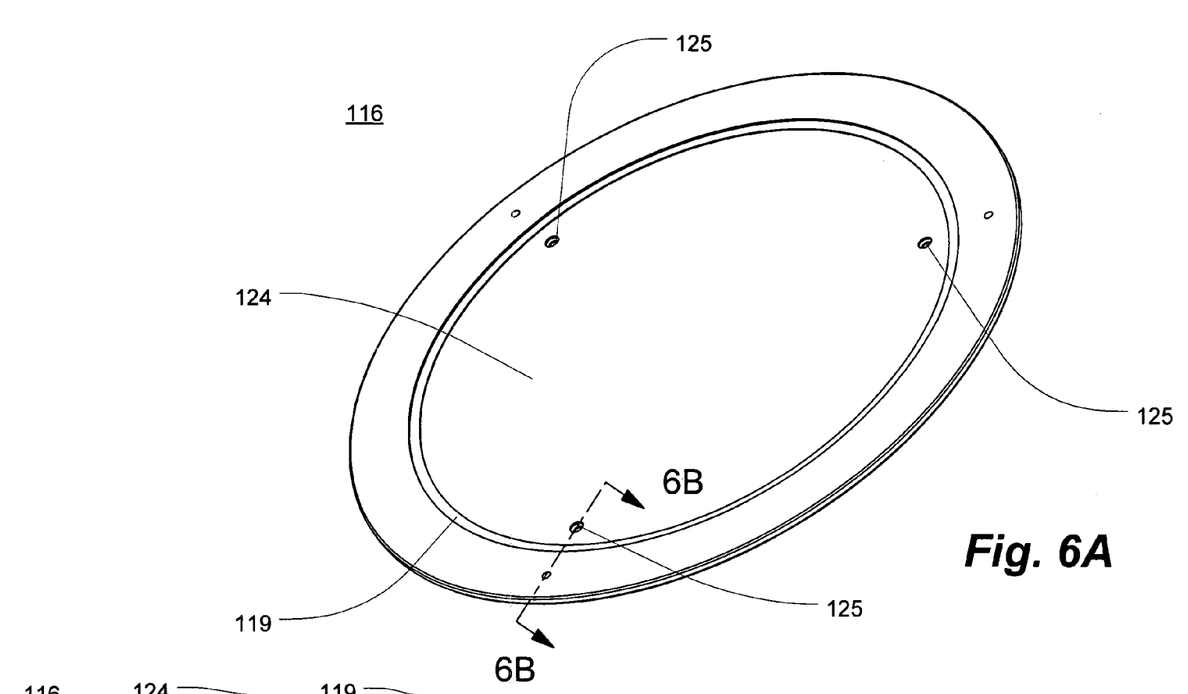
FIG. 6A is a perspective view of a prior art stepped-type wafer holder.
Figure 6B:
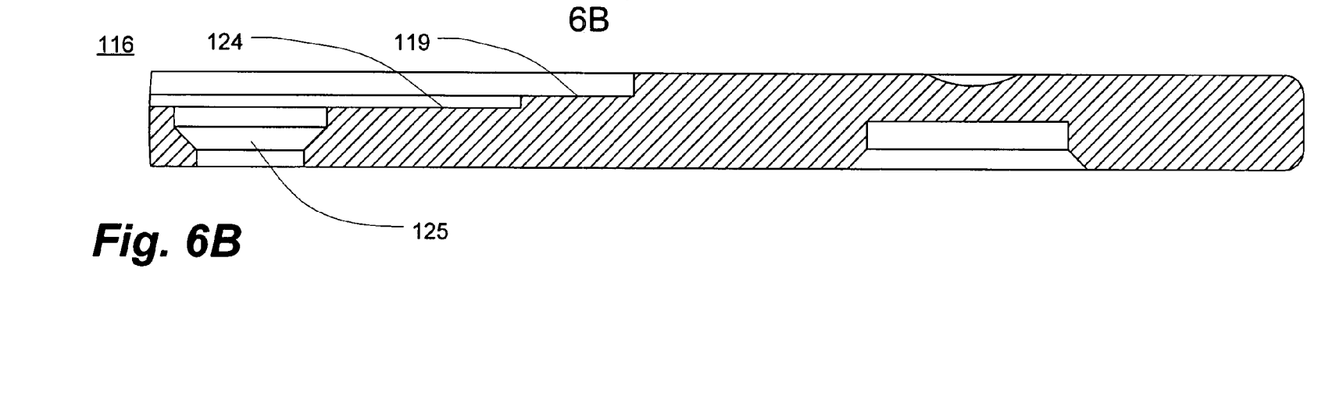
FIG. 6B is a partial side cross-sectional view of the wafer holder of FIG. 6A, taken along line 6B-6B.

The teachings of the present invention may be applied to other types of wafer holders as well. For example, FIG. 6A is a perspective view of a prior art stepped-type wafer holder 116, and FIG. 6B is a partial side cross-sectional view of the wafer holder 116 of FIG. 6A, taken along line 6B-6B. The stepped-type wafer holder 116 includes a circumferential ledge 119 around the perimeter of a wafer recess 124 for supporting the outer edges of a wafer 30. During processing, the wafer 30 conventionally sags into the wafer recess 124 in similar manner to that of the wafer holder 16 of the present invention. Typically, stepped-type wafer holders 116 use lift pins, disposed underneath the wafer 30 and arranged to project through openings 125 in the wafer recess 124, to raise the wafer 30 off the top of the holder 116 from underneath, rather than using a Bernoulli-type pickup to raise the wafer 30 from above. Although not specifically illustrated, the principles of the present invention may likewise be applied to stepped-type wafer holders 116 by applying slots (not shown) to the ledge 119. This would permit a stepped-type wafer holder 116 to use a conventional Bernoulli-type pickup during unloading operations.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A wafer holder for holding semiconductor substrate wafers in a chemical vapor deposition system, comprising:
   a unitary monolithic holder body having a top surface as an integral part of the holder body;
   a circular wafer recess in the top surface of the holder body, the wafer recess having an outer perimeter and an interior surface defined within the perimeter and being adapted to support a substrate wafer disposed entirely within the wafer recess and without any physical element between the surface of the substrate wafer facing the wafer recess and the interior surface of the wafer recess;
   a groove formed circularly into the interior surface of the wafer recess immediately adjacent and extending around the outer perimeter of the wafer recess; and
   a plurality of slots formed into the interior surface of the wafer recess in the holder body, substantially all of the slots connecting with the groove adjacent the outer perimeter of the wafer recess and extending radially inwardly therefrom and terminating at a spacing from the center of the wafer recess.

2. The wafer holder of claim 1, wherein the holder body is formed from at least one of the following: graphite, silicon, silicon nitride, silicon carbide, quartz or aluminum oxide.

3. The wafer holder of claim 1, wherein a surface coating is applied to at least the top surface of the holder body.

4. The wafer holder of claim 3, wherein the surface coating is formed from at least one of the following: silicon carbide, silicon nitride, pyrolytic graphite, pyrolytic carbon, diamond, aluminum nitride, aluminum oxide, silicon dioxide or tantalum carbide.

5. The wafer holder of claim 1, wherein the wafer recess encompasses a concave surface.

6. The wafer holder of claim 5, wherein the concave surface of the wafer recess is adapted to aid in gas flow beneath the substrate wafer disposed in the wafer recess.

7. The wafer holder of claim 5, wherein the concave surface of the wafer recess is adapted to help maintain a uniform temperature profile across the surface of the substrate wafer disposed in the wafer recess.

8. The wafer holder of claim 1, wherein the number of slots is selected to minimize negative effects on the thermal profile of the substrate wafer disposed in the wafer recess.

9. The wafer holder of claim 1, wherein the number of slots is selected to allow sufficient gas flow beneath the substrate wafer to aid in proper loading and unloading operations.

10. The wafer holder of claim 1, wherein the dimensions of the slots are selected to minimize negative effects on the thermal profile or backside markings of the substrate wafer disposed in the wafer recess.

11. The wafer holder of claim 1, wherein the dimensions of the slots are selected to provide effective gas flow beneath substrate wafers for the purpose of aiding in proper loading and unloading operations.

12. The wafer holder of claim 1, wherein each of the plurality of slots is between 0.035 in. and 0.065 in. in length.

13. The wafer holder of claim 1, wherein each of the plurality of slots is between 0.015 in. and 0.025 in. in width.

14. The wafer holder of claim 1, wherein each of the plurality of slots is at least 0.001 in. deep.

15. The wafer holder of claim 14, wherein each of the plurality of slots is between 0.004 in. and 0.008 in. deep.

16. The wafer holder of claim 1, wherein the wafer holder is a susceptor.

17. The wafer holder of claim 1, further comprising a circumferential ledge for supporting the edges of a wafer.

18. The wafer holder of claim 17, wherein the plurality of slots are disposed at least partly in the circumferential ledge.

19. The wafer holder of claim 1, wherein the wafer recess is a first wafer recess and the plurality of slots is a first plurality of slots, the wafer holder further comprising:
   a second circular wafer recess in the top surface of the holder body adjacent the first circular wafer recess, the wafer recess having an outer perimeter and an interior area; and
   a second plurality of slots arranged in the top surface of the holder body, each beginning adjacent the outer perimeter of the second wafer recess and extending toward and terminating in the interior area of the second wafer recess.

20. The wafer holder of claim 1, wherein
a the plurality of slots are non-intersecting with each other slots.

21. The wafer holder of claim 1, wherein each of the plurality of slots is between 0.030 in. and 1.000 in. in length; and wherein each of the plurality of slots is between 0.010 in. and 0.030 in. in width.

* * * * *